US006597203B2

(12) United States Patent
Forbes

(10) Patent No.: US 6,597,203 B2
(45) Date of Patent: Jul. 22, 2003

(54) CMOS GATE ARRAY WITH VERTICAL TRANSISTORS

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 47 days.

(21) Appl. No.: 09/808,369

(22) Filed: Mar. 14, 2001

(65) Prior Publication Data

US 2002/0130686 A1 Sep. 19, 2002

(51) Int. Cl.[7] .............................................. H03K 19/096
(52) U.S. Cl. ........................ 326/98; 326/101; 326/119
(58) Field of Search .............................. 326/93, 95, 96, 326/97, 98, 101, 112, 119, 83

(56) References Cited

U.S. PATENT DOCUMENTS

| | | | | |
|---|---|---|---|---|
| 4,797,580 A | | 1/1989 | Sunter | 307/451 |
| 5,402,012 A | * | 3/1995 | Thomas | 326/97 |
| 5,525,916 A | | 6/1996 | Gu et al. | 326/98 |
| 5,550,487 A | | 8/1996 | Lyon | 326/33 |
| 5,691,230 A | | 11/1997 | Forbes | 437/62 |
| 5,798,938 A | | 8/1998 | Heikes et al. | 364/490 |
| 5,828,234 A | | 10/1998 | Sprague | 326/98 |
| 5,867,036 A | | 2/1999 | Rajsuman | 326/16 |
| 5,942,917 A | | 8/1999 | Chappell et al. | 326/121 |
| 5,973,514 A | | 10/1999 | Kuo et al. | 326/98 |
| 5,976,282 A | | 11/1999 | Fukuda et al. | 148/606 |
| 6,040,716 A | * | 3/2000 | Bosshart | 326/98 |
| 6,072,209 A | * | 6/2000 | Noble et al. | 257/296 |

(List continued on next page.)

FOREIGN PATENT DOCUMENTS

JP  402277315 A  * 11/1990  ................... 326/88

OTHER PUBLICATIONS

Wu et al., "Analysis and Design of a New Race–Free Four–Phase CMOS Logic", Jan. 1993, IEEE Journal of Solid–State Circuits, vol. 28, No. 1, pp. 18–25.*
Bernstein, Kerry.,et al. , "High–Speed Design Styles Leverage IBM Technology Prowess", *Micro News (IBM MIcroelectronics)*, vol. 3, No. 4,, (1998).
Sakamoto, H..,et al. , "Grounded Load Complementary FET Circuits: Sceptre Analysis", *IEEE Journal of Solid–State Circuits, vol. SC–8, No. 4.*, (Aug. 1973),282–284.
Thorp, Tyler.,et al. , "Domino Logic Synthesis Using Complex Static Gates", *Proc. IEEE Conference On Computer–Aided Design*, (Nov. 8–12, 1998),242–247.
Thorp, Tyler.,et al. , "Monotonic Static CMOs and Dual Vt Technology", *Int. Sym. Low Power Electronics and Design*, San Diego, (Aug. 16–17, 1999), 151–155.

*Primary Examiner*—Daniel Chang
(74) *Attorney, Agent, or Firm*—Schwegman, Lundberg, Woessner & Kluth, P.A.

(57) ABSTRACT

Structures and methods for CMOS gate arrays with vertical transistors are provided. The CMOS gate arrays with vertical transistors comprise a logic circuit. The logic circuit includes a dynamic pull-down circuit having a number of logic inputs, a clock input, and an output. The number of logic inputs are coupled to a number of gates of free standing vertical n-channel transistors. The clock input is coupled to a gate of a free standing vertical p-channel transistor for precharging the output. The logic circuit further includes a static pull-up circuit having a number of logic inputs, a clock bar input, and an output. The number of logic inputs are coupled to a number of gates of free standing vertical n-channel transistors. The clock bar input is coupled to a gate of a free standing vertical n-channel transistor for precharging the output. And, the dynamic pull down circuit is cascaded with the static pull up circuit such that one of the number of inputs for the pull up circuit is coupled to the output of the pull down circuit.

62 Claims, 9 Drawing Sheets

U.S. PATENT DOCUMENTS

| | | | |
|---|---|---|---|
| 6,107,835 A | 8/2000 | Blomgren et al. | 326/98 |
| 6,108,805 A | 8/2000 | Rajsuman | 714/724 |
| 6,150,687 A * | 11/2000 | Noble et al. | 257/302 |
| 6,174,784 B1 | 1/2001 | Forbes | 438/405 |
| 6,275,071 B1 * | 8/2001 | Ye et al. | 326/98 |
| 6,304,123 B1 * | 10/2001 | Bosshart | 327/212 |
| 6,316,960 B2 * | 11/2001 | Ye | 326/95 |
| 6,350,635 B1 | 2/2002 | Noble et al. | 438/156 |
| 6,399,979 B1 | 6/2002 | Noble et al. | 257/302 |
| 6,476,434 B1 | 11/2002 | Noble et al. | 257/302 |
| 6,504,201 B1 | 1/2003 | Noble et al. | 257/302 |

\* cited by examiner

CMOS GATE ARRAY WITH VERTICAL TRANSISTORS

FIELD OF THE INVENTION

The present invention relates generally to integrated circuits and CMOS gate arrays. In particular, the invention relates to monotonic dynamic-static pseudo-NMOS logic circuits.

BACKGROUND OF THE INVENTION

CMOS technology is used not only for digital integrated circuits due to a low power dissipation, a high density of integration and a low cost of fabrication but also for analog integrated circuits. The most important applications that are using microelectronic components, such as telecommunication equipment, industrial control equipment, auto electronics, require more and more specialized integrated circuits. The continuing development in the semiconductors has led to implementation and use of gate arrays and standard cells as the most modem and inexpensive way to produce ASIC's, Application Specific Integrated Circuits. Gate arrays technologies have a special place in the ASIC design. An ASIC is an integrated circuit that can place on a single chip an entire system or a great part of it, performing not only digital, but also analog functions. A CMOS gate array can be simply described as a matrix of pre-manufactured identical cells that only requires the addition of the final metal and contact masks to define a new circuit function. The gate array technology can quickly respond to the customer requirements in a low cost and efficient manner. Gate arrays can be implemented in a variety of circuit and process technologies including most commonly static CMOS and bipolar emitter coupled logic.

FIG. 1 shows a prior art conventional static CMOS logic circuit. There are a number of problems with static CMOS logic circuits. A first problem with static CMOS logic circuits is that each input 112 and 114 must drive two gates, the gate of one NMOS transistor and the gate of a PMOS transistor. Input 112 drives gates 116 and 118, and input 114 drives gates 120 and 122. This results in a large area for static CMOS circuits and a large number of metal wiring levels must be utilized to allow interconnections.

Another problem with static CMOS logic circuits is that in the PMOS transistor the hole mobility is about three times lower than the mobility of electrons if the transistors have comparable sizes. Because of this, switching transients are very asymmetrical. The charge up transient of the capacitive load in a simple inverter takes far longer than the discharge transient. To attempt to compensate, the PMOS transistors are often fabricated with a large width or size to provide symmetrical switching. However, this increases the stray capacitive loads and results in an even larger area for the circuits, and very inefficient area utilization.

A number of other approaches to overcome these shortcomings have been developed and are discussed further in the detailed description portion of the present application. However, as detailed therein, each presents or introduces new shortcomings to the circuit design.

Therefore, there is a need in the art to provide CMOS gate arrays which result in faster switching speeds, use far fewer devices to conserve chip surface space, and which require much less wiring and circuit complexity that conventional logic array approaches.

SUMMARY OF THE INVENTION

The above mentioned problems with CMOS gate arrays and other problems are addressed by the present invention and will be understood by reading and studying the following specification. Systems and methods are provided for CMOS gate arrays with vertical transistors In one embodiment of the present invention, CMOS gate arrays with vertical transistors are used to form a logic circuit. The logic circuit includes a dynamic pull-down circuit having a number of logic inputs, a clock input, and an output. The number of logic inputs are coupled to a number of gates of free standing vertical n-channel transistors. The clock input is coupled to a gate of a free standing vertical p-channel transistor for precharging the output. The logic circuit further includes a static pull-up circuit having a number of logic inputs, a clock bar input, and an output. The number of logic inputs are coupled to a number of gates of free standing vertical n-channel transistors. The clock bar input is coupled to a gate of a free standing vertical n-channel transistor for precharging the output. And, the dynamic pull down circuit is cascaded with the static pull up circuit such that one of the number of inputs for the pull up circuit is coupled to the output of the pull down circuit.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1:
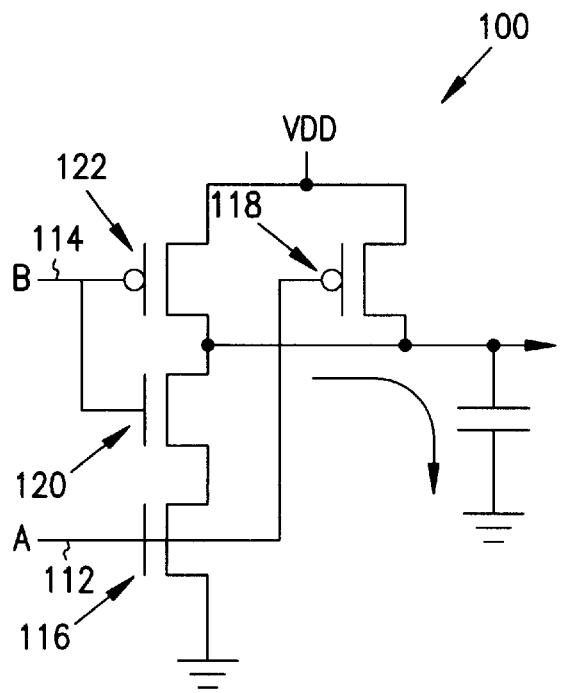
FIG. 1 is a schematic diagram showing a conventional static CMOS logic circuit.

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

The invention provides a monotonic dynamic-static pseudo-NMOS logic circuit. The monotonic dynamic-static pseudo-NMOS logic circuit includes a dynamic logic circuit having a number of logic inputs, a clock input, and an output. According to the teachings of the present invention, the number of logic inputs are coupled to a number of gates of free standing vertical n-channel transistors. The clock input is coupled to a gate of a free standing vertical p-channel transistor for precharging the output. The monotonic dynamic-static pseudo-NMOS logic circuit further includes a static logic circuit having a number of logic inputs, a clock bar input, and an output. Again, the number of logic inputs are coupled to a number of gates of free standing vertical n-channel transistors. The clock bar input is coupled to a gate of a free standing vertical n-channel transistor for precharging the output. According to the teachings of the present invention, one of the number of inputs for the static logic circuit is coupled to the output of the dynamic logic circuit.

According to the teachings of the present invention, the number of free standing vertical n-channel transistors in the dynamic logic circuit and the static logic circuit are configured to perform a logic function. In one embodiment of the invention, the clock input of the dynamic logic circuit is configured to precharge the output high prior to the arrival of a number of input signals at the number of logic inputs to the dynamic logic circuit. In one embodiment, the clock bar input of the static logic circuit is configured to precharge the output of the static logic circuit low prior to the arrival of a number of input signals at the number of logic inputs to the static logic circuit. In one embodiment, the clock input of the dynamic logic circuit receives a clock low signal and the clock bar input of the static logic circuit receives a complement high signal to precharge the respective outputs during a precharge stage. A number of input signals are received at the number of logic inputs for the dynamic logic circuit during an evaluation stage when the clock input receives a high signal in order to implement a logic function in the dynamic logic circuit. A number of input signals are likewise received at the number of logic inputs for the static logic circuit during an evaluation stage when the clock bar input receives a low signal in order to implement a logic function in the static logic circuit.

In the dynamic logic circuit, the number of free standing vertical n-channel transistors are configured to define a logic function, coupled between a low voltage and the output configured to be precharged high. In the static logic circuit, the number of free standing vertical n-channel transistors are configured to define a logic function, coupled between a low voltage, or ground, and the output configured to be precharge low. In the dynamic logic circuit, the free standing vertical p-channel transistor has its gate coupled to the clock input, and has a channel coupled between a power supply voltage, e.g. VDD, and the output to be precharged high. In the static logic circuit, a free standing vertical p-channel transistor has its gate coupled to the clock bar input, and has a channel coupled between a power supply voltage, e.g. VDD, and the output. A free standing vertical n-channel transistor is provided having its gate coupled to the clock bar input, and having a channel coupled between a low voltage, or ground, and the output configured to be precharged low.

According to the teachings of the present invention, the number of free standing vertical n-channel transistors and the free standing vertical p-channel transistors in the dynamic and the static logic circuits include a number of free standing vertical transistors formed according to the teachings of the present invention as described in more detail below. The number of free standing vertical n-channel transistors provide a logic gate array comprising a plurality of free standing vertical n-channel transistors coupled together. As one of ordinary skill in the art will understand from further reading this disclosure, the vertical configuration of devices in the present application provides for a less complex wiring scheme. As will be further understood the novel logic circuit requires fewer devices and the vertical configuration of the devices allows for greater circuit density.

Figure 2:
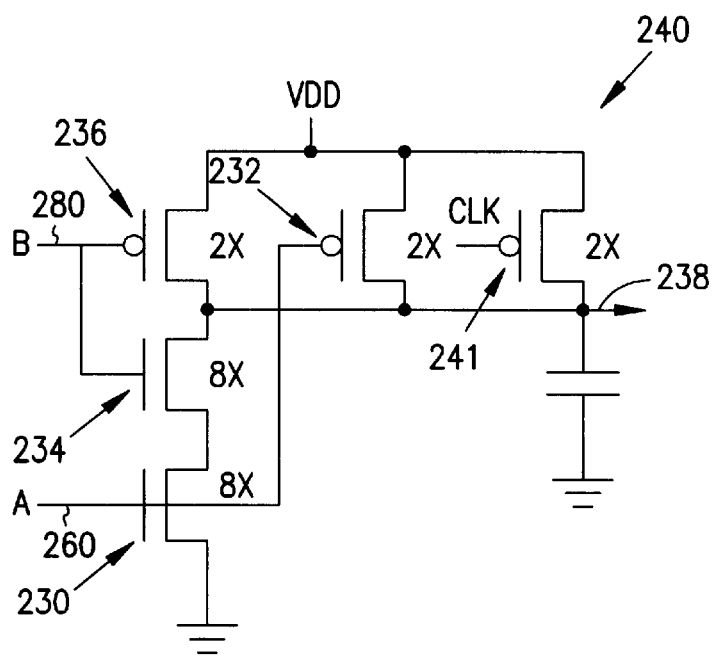
FIG. 2 is a schematic diagram showing a low skew NAND of a monotonic CMOS logic circuit.
Figure 3:
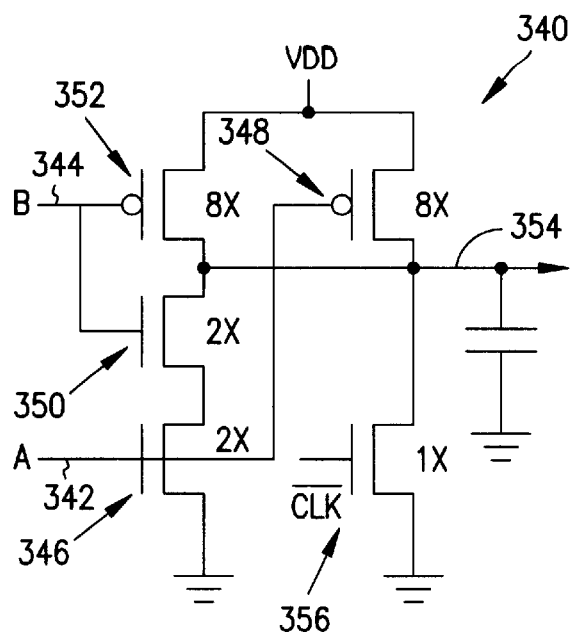
FIG. 3 is a schematic diagram showing a high skew NAND of a monotonic CMOS logic circuit.

FIGS. 2 and 3 show monotonic static CMOS logic circuits (logic gates) 240 and 340, respectively. Monotonic static CMOS circuit 240 is a low skewed logic circuit 240 having devices which are sized so that the logic circuit 240 has a fast fall delay at the expense of a slow rise delay. That is, the NMOS devices in circuit 240 are shown with a speed of 8× while the PMOS devices in circuit 240 are shown with a transient switching speed of 2×. In contrast, monotonic static CMOS circuit 340 is a high skewed logic circuit 340 designed to provide a fast pull-up. As shown in circuit 340, the PMOS devices are reflected as having a transient switching speed of 8× whereas the NMOS devices are shown with a transient switching speed of 2× for the logic transistors and 1× for the clock bar input precharge NMOS device. As one of ordinary skill in the art will understand upon reading this disclosure, the monotonic static CMOS logic circuits of FIGS. 2 and 3 introduce the problem of having to asymmetrically size the PMOS and NMOS devices in order to achieve the desired circuit functionality. Having to do so, consumes added chip surface area thus reducing the overall logic circuit density.

The low skewed logic circuit 240 in FIG. 2 is a conventional monotonic static CMOS logic circuit. In FIG. 2, the low skewed static CMOS logic circuit 240 has inputs 260 and 280. Input 260 drives gates 230 and 232. Input 280 drives gates 234 and 236. A clock input, CLK, is provided to a gate 241. The high skewed logic circuit in FIG. 3 is also a conventional monotonic static CMOS logic circuit. The high skewed static CMOS logic circuit 340 has inputs 342 and 344. Input 342 drives gates 346 and 348. Input 344 drives gates 350 and 352. A complementary clock signal CLK BAR is provided to a gate 356 of the circuit 340. When CLK is low, the output 238 of the logic circuit 240 is precharged to a logic 1 and the output 354 of the logic circuit 340 is precharged to a logic 0. During the evaluation phase of CLK, the output 238 of the logic circuit 240 will either switch from 1 to 0 or remain at the precharged value. Similarly, the output 354 of the logic circuit 340 will either switch from 0 to 1 or remain at the precharged value. A path of monotonic static logic circuits must alternate with low skewed and high skewed logic circuits. A low skewed logic circuit drives a high skewed logic circuit and vice versa.

Monotonic static CMOS logic circuits are known in the art and are discussed, for example, in T. Thorp, G. Yee and C. Sechen, "*Monotonic Static CMOS and Dual VT Technology,*" Int. Sym. Low Power Electronics and Design, San Diego, Aug. 16–17, 1999, pp 151–155. In the circuit 240, the large charge up time through the PMOS devices is avoided by precharging output node 238 to VDD by the use of the clock, CLK. When the clock CLK is low, the PMOS transistor 241 will be on and the output load capacitance will be precharged to VDD. Similarly, in the complementary logic circuit 340 of FIG. 3, the complementary clock voltage CLK BAR will be high and the output 354 precharged to a low voltage or ground.

The outputs of the monotonic static CMOS logic circuits of FIGS. 2 and 3 are preset. That is, the output 238 of the pull-down circuit 240 is preset, or precharged, high. Similarly, the output 354 of the pull-up circuit 340 is preset, or precharged low. Hence, monotonic static CMOS logic circuits of FIGS. 2 and 3 either stay with the precharged output value or switch to the opposite logic value during evaluation. This is called monotonic behavior. For example, the only possible output transitions for a pull-down logic circuit 240 are 1 to 1, and 1 to 0. This is in contrast to regular static CMOS circuits, in which an output can perform any of the following transitions: 0-0, 1-1, 0-1, and 1-0, but which possess the inherent problem of asymmetrical switching when the devices are comparably sized or which consume added chip space when the devices are asymmetrically sized to overcome the asymmetry in the switching transients. As described above, the conventional monotonic static CMOS logic circuits 240 and 340 are cascaded with one of the first type, e.g. low skew pull-down or high skew pull-up, then one of the second type, then one of the first type, etc.

In FIG. 2, the conventional monotonic static CMOS logic circuit 240 is a low skew NAND. When CLK is low, logic circuit 240 is precharged high. Evaluation in circuit 240 takes place when CLK is high. During evaluation, the output 238 switches from 1 to 0 remains high. In FIG. 3, the conventional monotonic static CMOS logic circuit 340 is a high skew NAND. When CLK is low, CLK BAR is high, and circuit 340 is precharged low. Evaluation in circuit 340 takes place when CLK is high (CLK BAR is low). During evaluation, the output 354 switches from 0 to 1 or remains the same.

By an appropriate logic optimization of the inputs and arrangement of the circuits, the circuits can be placed so as to minimize signal delays through the circuit and minimize power consumption. This is possible because the circuit nodes are precharged prior to any of the input data becoming high and a monotonic logic evaluation of these inputs to the circuit. The sizes of the devices can be optimized to quickly discharge the charged nodes and quickly charge the discharged nodes. A 1.5 times speed improvement and a 1.5 times area reduction has been demonstrated over conventional static CMOS logic by using the monotonic static CMOS logic circuits shown in FIGS. 2 and 3.

Again, as one of ordinary skill in the art will understand upon reading this disclosure, the monotonic static CMOS logic circuits of FIGS. 2 and 3 introduce the problem of having to asymmetrically size the PMOS and NMOS devices in order to achieve the desired circuit functionality. The monotonic CMOS logic circuits of FIGS. 2 and 3 require stacked CMOS pairs which creates a restriction on circuit layout dictating a more complex circuit layout with bigger and more devices. Thus, the monotonic static CMOS logic circuits consume added chip surface area thus reducing the overall logic circuit density.

Figure 4:
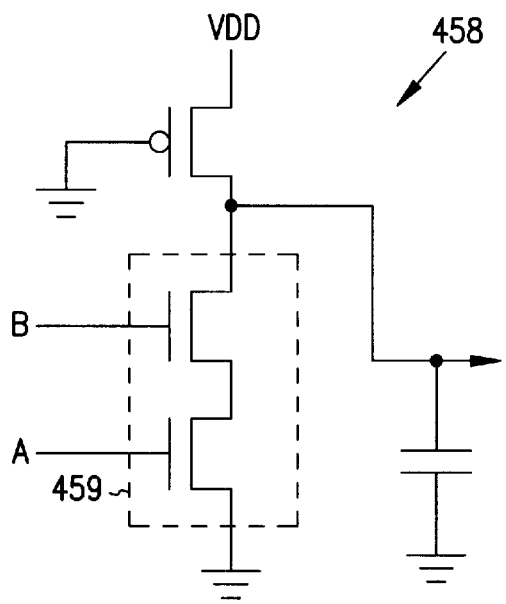
FIG. 4 is a schematic diagram for a pseudo-NMOS static logic circuit.

FIG. 4 is a schematic diagram illustrating a conventional pseudo NMOS static logic circuit 458. In FIG. 4, the conventional pseudo NMOS static logic circuit 458 includes logic circuitry 459 defining a logic function. In the embodiment shown in FIG. 4, logic circuitry 459 defines a two input NAND function. However, as one of ordinary skill in the art will understand, different logic functions could be implemented. In a pseudo NMOS static logic circuit 458, the PMOS devices act as load devices, much like as depletion mode load devices in an enhancement-depletion NMOS static logic circuit. Although wiring complexity is significantly reduced by use of a conventional pseudo NMOS static logic circuit 458, a new difficulty is introduced due to static DC power consumption. Static DC power consumption can be avoided by using clocked sequential dynamic logic families like domino CMOS or NORA (no race) dynamic logic, or a combination of dynamic and static logic. Other circuit techniques include zipper CMOS and sequentially clocked or clock-delayed logic circuits. However as shown more below, this just re-introduces complexity into the circuit design, hence a trade-off remains.

Figure 5:
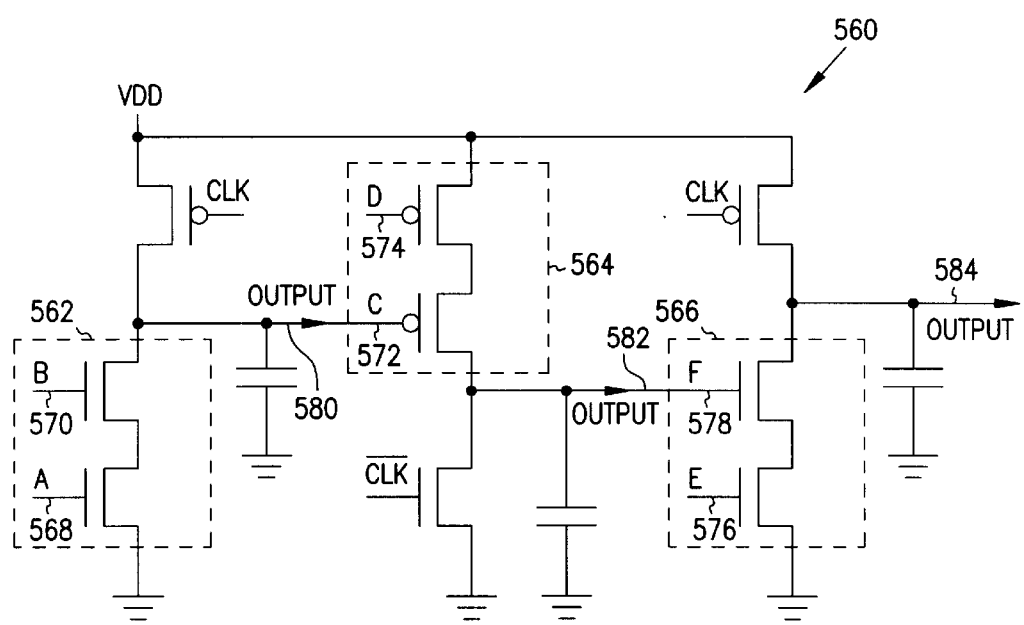
FIG. 5 is a schematic diagram for a zipper-CMOS logic circuit.

FIG. 5 is a schematic diagram illustrating a conventional zipper CMOS logic circuit 560. As shown in FIG. 5, the conventional zipper CMOS logic circuit 560 includes logic circuitry 562, 564, and 566 defining logic functions. In FIG. 5, the conventional zipper CMOS logic circuit 560 is shown with inputs 568, 570, 572, 574, 576, and 578, and with outputs 580, 582, and 584. In the conventional zipper CMOS logic circuit 560, the precharge phase is when the clock CLK is low (the complement CLK BAR is high). Evaluation occurs when the clock, CLK, goes high in a manner similar to evaluation at CLK high for the conventional monotonic static CMOS logic circuits of FIGS. 2 and 3. In the conventional zipper CMOS logic circuit 560 of FIG. 5, the signals and logic decisions propagate through a chain defined by logic circuitry 562, 564, and 566 like a mechanical zipper closing, hence the name zipper CMOS.

Zipper CMOS, pseudo NMOS, and domino logic circuits are described, for example, in the following U.S. patents, all of which are incorporated herein by reference: U.S. Pat. No. 6,108,805 to Rajsuman; U.S. Pat. No. 6,107,835 to Blomgren et al.; U.S. Pat. No. 5,973,514 to Kuo et al.; U.S. Pat. No. 5,942,917 to Chappell et al.; U.S. Pat. No. 5,828,234 to Sprague; U.S. Pat. No. 5,867,036 to Rajsuman; U.S. Pat. No. 5,798,938 to Heikes et al.; U.S. Pat. No. 5,976,282 to Sprague et al.; U.S. Pat. No. 5,550,487 to Lyon; U.S. Pat. No. 5,525,916 to Gu et al.; U.S. Pat. No. 4,797,580 to Sunter; U.S. Pat. No. 4,569,032 to Lee.

As one of ordinary skill in the art will understand upon reading this disclosure, the above circuits do not lend themselves to very high density layouts and would not be consistent with the use of vertical devices as taught by the present invention. That is, these circuits again require stacked devices and asymmetrical switching and sizing since PMOS devices are still used for logic functions in alternating stages.

Figure 6:
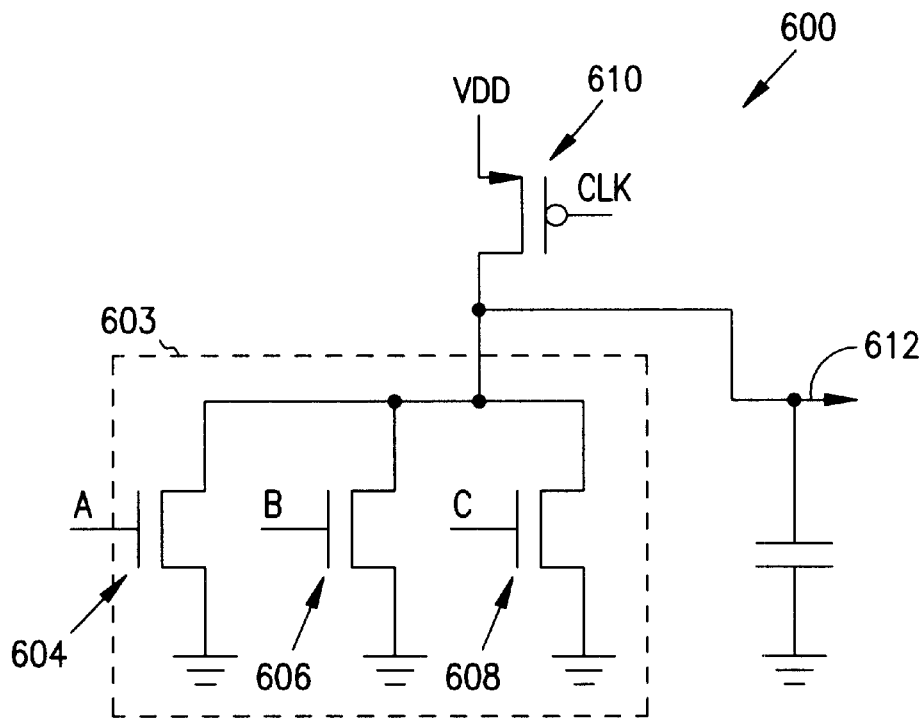
FIG. 6 is a schematic diagram showing a dynamic portion of a monotonic dynamic-static pseudo-NMOS logic circuit according to the teachings of the present invention.
Figure 7:
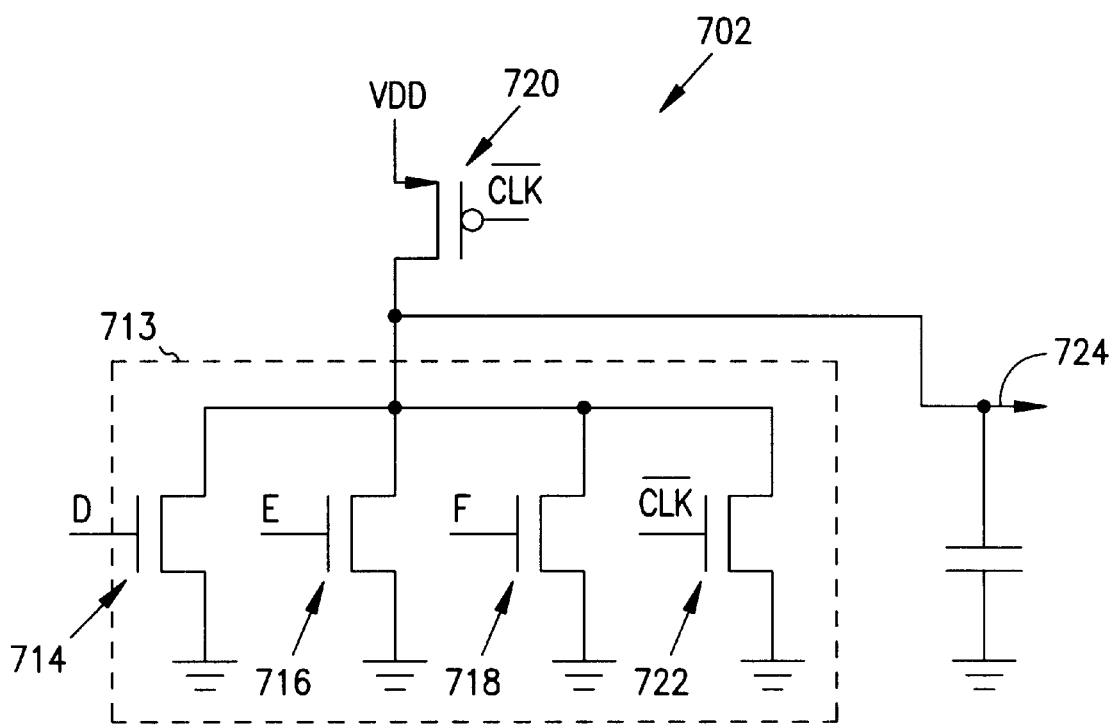
FIG. 7 is a schematic diagram showing a static portion of a monotonic dynamic-static pseudo-NMOS logic circuit according to the teachings of the present invention.

FIGS. 6 and 7 are schematic diagrams illustrating monotonic static CMOS logic circuits (or logic gates, cells, blocks, or stages) 600 and 702 which are then configured in a monotonic dynamic-static pseudo-NMOS circuit family in accordance with embodiments of the present invention. According to the teachings of the present invention, FIG. 6 illustrates a dynamic pull-down circuit 600, or dynamic logic circuit 600 which is configured to precharge an output 612 high. As shown in FIG. 6, logic circuit 600 includes a gate array 603, or logic circuitry 603. Gate array, or logic circuitry 603, has a number of inputs A, B, and C. As shown in FIG. 6, the number of inputs are coupled to the gates of a number of free standing vertical n-channel transistors 604, 606, and 608, respectively. The number of free standing vertical n-channel transistors are coupled between a low voltage supply, or ground, and the output 612. In the embodiment of FIG. 6, the gate array 603, or logic circuitry 603 shows a three input NOR logic configuration. The present invention is not so limited and one of ordinary skill in the art will understand upon reading this disclosure that logic circuitry 603 can be configured to perform any one of multiple possible logic functions.

Circuit 600 further includes a clock input, CLK, coupled to a source of a clock signal. According to the teachings of the present invention, clock input CLK is coupled to a gate of a free standing vertical p-channel transistor 610. The free standing vertical p-channel transistor is coupled between a voltage supply, e.g. VDD, and the output 612. As one of ordinary skill in the art will understand upon reading this disclosure, the number of free standing vertical n-channel transistors and the free standing vertical p-channel transistor include free standing vertical transistors formed according to a process described herein. According to the teachings of the present invention, the circuit 600 is a dynamic circuit 600 which is precharged high at the output 612. That is, the output 612 is precharged high upon receiving a low clock signal at clock input CLK. As will be understood by one of ordinary skill in the art upon reading this disclosure, the output 612 is precharged high prior to receiving a number of input signals on the number of inputs A, B, and C. Thus circuit 600 exhibits monotonic behavior.

FIG. 7 illustrates a static pull-up circuit 702 which is configured to precharge an output 724 low according to the teachings of the present invention. As shown in FIG. 7, logic circuit 702 includes a gate array 713, or logic circuitry 713. The illustrated logic circuitry 713 is shown having inputs D, E, and F. As shown in FIG. 7, the number of inputs D, E, and F are coupled to the gates of a number of free standing vertical n-channel transistors 714, 716, and 718, respectively. The number of free standing vertical n-channel transistors are coupled between a low voltage supply, or ground, and the output 724. In the embodiment of FIG. 7, the gate array 713, or logic circuitry 713 shows a three input NOR logic configuration. However, the present invention is not so limited and one of ordinary skill in the art will understand upon reading this disclosure that logic circuitry 713 can be configured to perform any one of multiple possible logic functions. For example, an inverter can be implemented by using a different number of transistors in logic circuitry 713.

As shown in FIG. 7, logic circuit 702 also includes a pair of clock bar inputs CLK BAR coupled to the source of the clock signal of FIG. 6 in order to receive the complement of that clock signal. Circuit 702 illustrates that the clock bar input CLK BAR is coupled to a gate of a free standing vertical p-channel transistor 720 and to a gate of a free standing vertical n-channel transistor 722. The free standing vertical p-channel transistor 720 is coupled between a voltage supply, e.g. VDD, and the output 724. The free standing vertical n-channel transistor 722 is coupled between a low voltage potential, or ground, and the output 724. As one of ordinary skill in the art will understand upon reading this disclosure, the number of free standing vertical n-channel transistors and the free standing vertical p-channel transistor include free standing vertical transistors formed according to a process described herein. According to the teachings of the present invention, the circuit 702 is a static circuit 702 which is precharged low at the output 724. That is, the output 724 is precharged low upon receiving a high clock signal at clock bar input, CLK BAR. As will be understood by one of ordinary skill in the art upon reading this disclosure, the output 724 is precharged low prior to receiving a number of input signals on the number of inputs D, E, and F. That is, in both the dynamic logic circuit 600 and the static logic circuit 702, the outputs, 612 and 724, are precharged high or low, respectively, during a precharge stage. The number of logic inputs A, B, C, D, E, and F coupled to the number of gates of free standing vertical n-channel transistors are configured for receiving a number of input signals during an evaluation stage when the clock input CLK receives a high signal and the CLK BAR input receives a low signal.

As one of ordinary skill in the art will understand upon reading this disclosure, the static logic circuit 702 is termed so since the circuit 702 still experiences some power dissipation having a dc path down through it.

Figure 8:
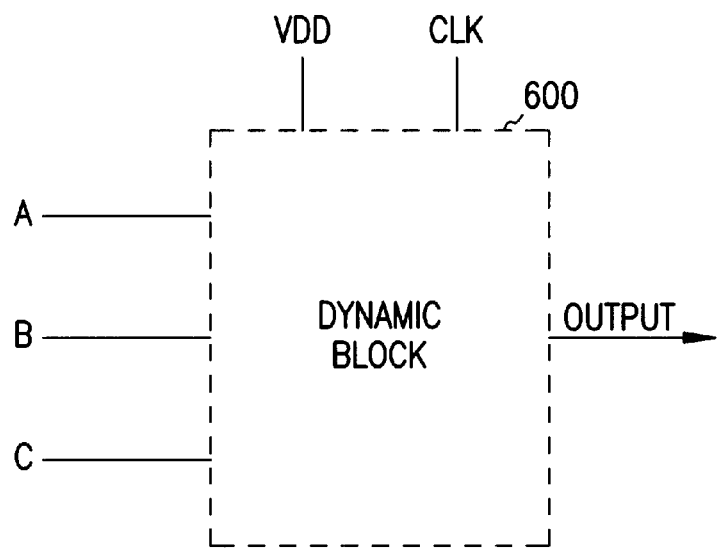
FIG. 8 is a block diagram representation of the circuit of FIG. 6.
Figure 9:
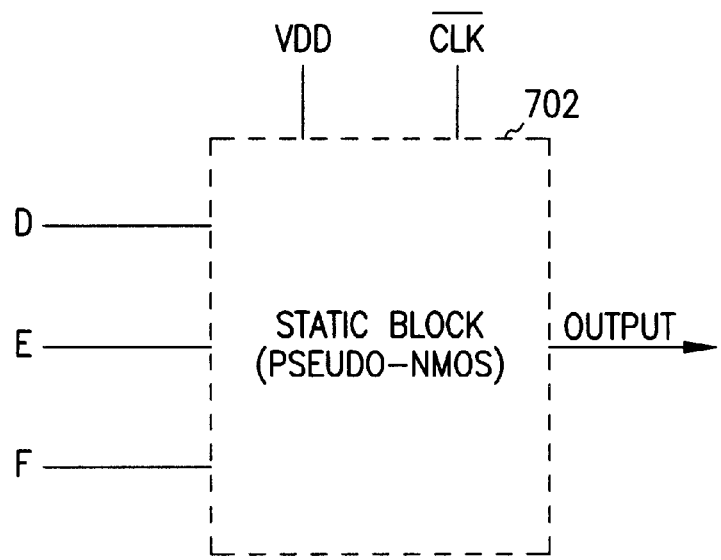
FIG. 9 is a block diagram representation of the circuit of FIG. 7.

FIGS. 8 and 9 are simplified block diagram representations of the circuits 600 and 702 of FIGS. 6 and 7, respectively.

As one of ordinary skill in the art will understand upon reading this disclosure, circuits, such as the circuits 600 and 702 are configured to be coupled together in sequence in an alternating fashion; e.g., one high precharge pull-down circuit, or dynamic logic circuit (e.g., circuit 600), one low precharge pull-up circuit, or static logic circuit (e.g., 702), one high precharge circuit, one low precharge circuit, and so on.

Figure 10:
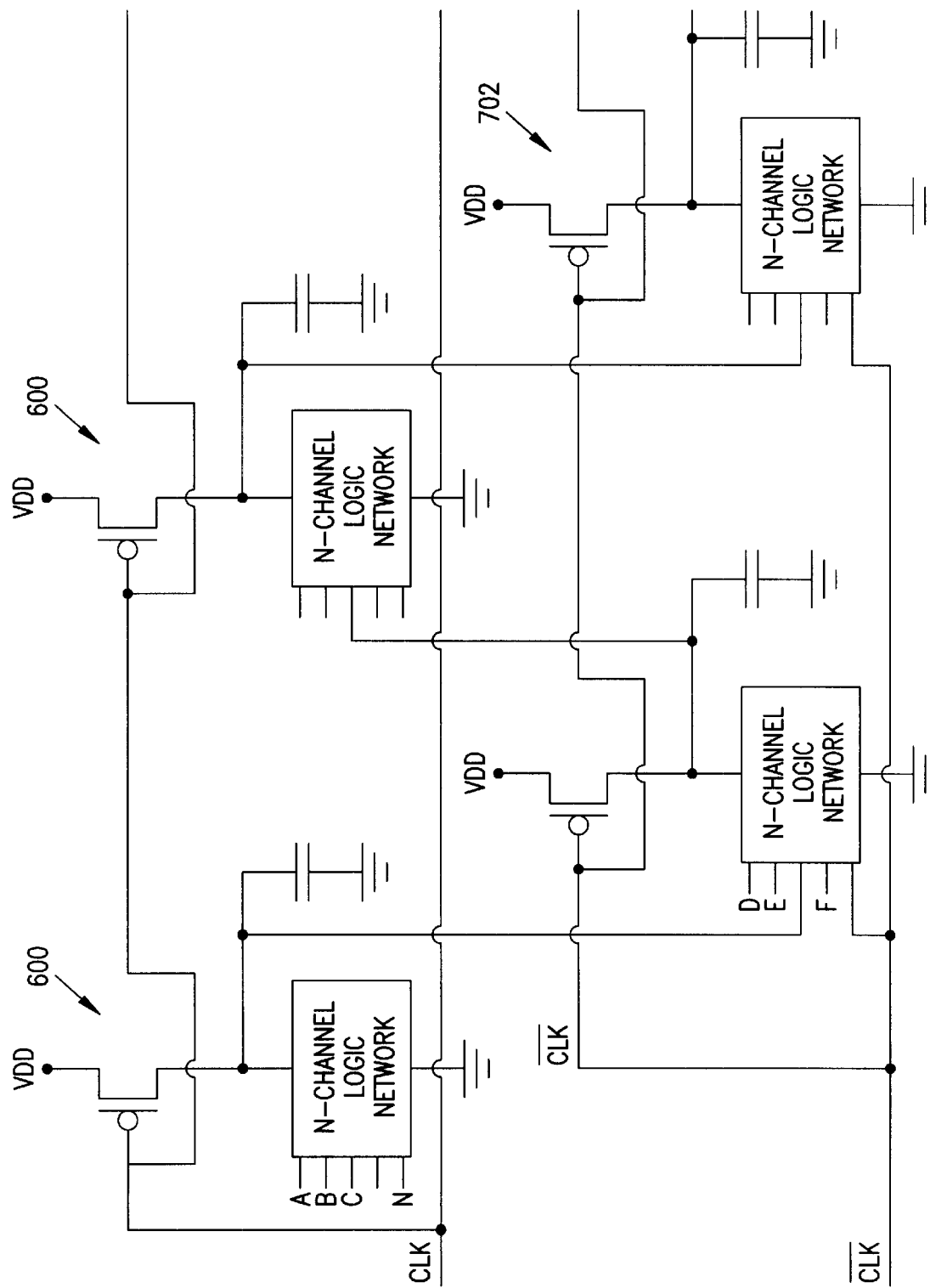
FIG. 10 is a schematic diagram illustrating multiple circuits of the type shown in FIGS. 6 and 7 coupled together.

FIG. 10 illustrates circuits 600 and 702 configured in a monotonic dynamic-static pseudo-NMOS circuit family. According to teachings of the present invention, the circuits 600 and 702 are precharged when the clock input, CLK, at the gate of free standing vertical p-channel transistor 610 receives a low signal and the clock bar input, CLK BAR, at the gate of free standing vertical n-channel transistor 722 receives the complement, or high signal. According to the teachings of the present invention, the precharge precedes receiving an number of input signals the number of logic inputs A, B, C, D, E, and F. That is, following the precharge a number of input signals are received at some or all of the inputs A, B, C, D, E, and F. Upon receiving the input signals, some or all of the free standing vertical n-channel transistors which make up the gate arrays 603 and 713 can change state and monotonic evaluation of the input signals will be performed by the gate arrays 603 and 713 of logic circuits 600 and 702.

According to the teachings of the present invention, the outputs 612 and 724 of the logic circuits 600 and 702 are preset/precharged high for pull-down circuits, dynamic logic circuits, e.g. circuits 600, and preset/precharged low for pull-up circuits, static logic circuits, e.g. circuits 702. Therefore the logic circuits 600 and 702 either retain their respective precharged output value, e.g. 0 or 1, or switch to the opposite logic value during evaluation. This is monotonic behavior.

According to the teachings of the present invention, the precharge in the dynamic logic circuit 600 occurs when a low signal is received at the clock input, CLK, coupled to the free standing vertical p-channel transistor 610. The precharge in the static logic circuit 702 occurs when a complement signal, or high signal is received at the clock bar input, CLK BAR, coupled to the free standing vertical n-channel transistor 722. Evaluation in the dynamic logic circuit 600 occurs when a high signal is received at the clock input, CLK, coupled to the free standing vertical p-channel transistor 610 and a number of input signals are received at the number of inputs A, B, and C, coupled to the number of free standing vertical n-channel transistors, 604, 606, and 608. The evaluation in the static logic circuit 702 occurs when a complement signal, or low signal, is received at the clock bar input, CLK BAR, coupled to the free standing vertical n-channel transistor 722 and a number of input signals are received at the number of inputs, D, E, and F, coupled to the number of free standing vertical n-channel transistors, 714, 716, and 718. Because the first stage is dynamic and the next stage is static, and since all of the logic functions are performed by NMOS devices, the circuit family shown in FIG. 10 including circuits 600 and 702 is most appropriately referred to as a monotonic dynamic-static pseudo-NMOS logic circuit.

As is the case with monotonic static CMOS logic, the inputs and arrangement of the circuits 600 and 702 can be arranged to minimize signal delays through the circuit, and to minimize power consumption, using synthesis techniques known in the art and described, for example, in T. Thorp, G. Yee and C. Sechen, "*Monotonic Static CMOS and Dual VT Technology*," Int. Sym. Low Power Electronics and Design, San Diego, Aug. 16–17, 1999, pp 151–155 (see above). This is possible because the outputs 612 and 724 are precharged prior to any of the input data, or input signals, being received and becoming high at the inputs, A, B, C, D, E, and F, and prior to a monotonic logic evaluation of these inputs, A, B, C, D, E, and F, by the free standing vertical n-channel transistors, 604, 606, 608, 714, 716, and 718, of the gate arrays 603 and 713, respectively of circuits 600 and 702. In one embodiment, the device sizes are optimized to quickly discharge the charged nodes and quickly charge the discharged nodes. Further, as will be understood by one of ordinary skill in the art upon reading this disclosure, the monotonic dynamic-static pseudo-NMOS logic circuits of the present invention lend themselves to implementation with free standing vertical transistors as described herein. Thus, the present invention affords logic circuits with a very high density layout.

As one of ordinary skill in the art will understand upon reading this disclosure, the monotonic dynamic-static pseudo-NMOS of the present invention, including circuits 600 and 702, combine for both fast switching transients with minimized clock delay and lower power consumption. In the monotonic dynamic-static pseudo-NMOS of the present invention, including circuits 600 and 702, the second stage is static and uses NMOS devices for the evaluation. This is in contrast, for example, to zipper-CMOS where PMOS devices are used in the second stage. The use of NMOS devices in applicant's monotonic dynamic-static pseudo-NMOS results in a faster switching speed, though at the expense of some DC power dissipation. However, the DC power dissipation in the monotonic dynamic-static pseudo-NMOS of the present invention, including circuits 600 and 702, is still not as great as that which occurs in conventional pseudo NMOS static logic circuits as shown in FIG. 4. Thus, the monotonic dynamic-static pseudo-NMOS logic circuit of the present invention, including circuits 600 and 702 offer a significant advantage over the prior art in that the novel circuitry uses far fewer devices, much less area, and much less wiring than domino static-CMOS logic configurations.

While full rail CMOS voltages, such as 5 volts and ground, could be used to define the high and low voltages, in other embodiments, different voltages are used as will be readily apparent to one of ordinary skill in the art. For example, 4 volts and 1 volts could be used to define the high and low voltages, respectfully; anything above a certain threshold could be considered high and anything below a certain threshold could be considered low, or a negative voltage could be used for the low voltage or for both the high and low voltages. As long as the high and low voltages can be distinguished form one another with sufficient reliability for the specific application, any voltages can be used to define the high and low voltages.

Figure 11:
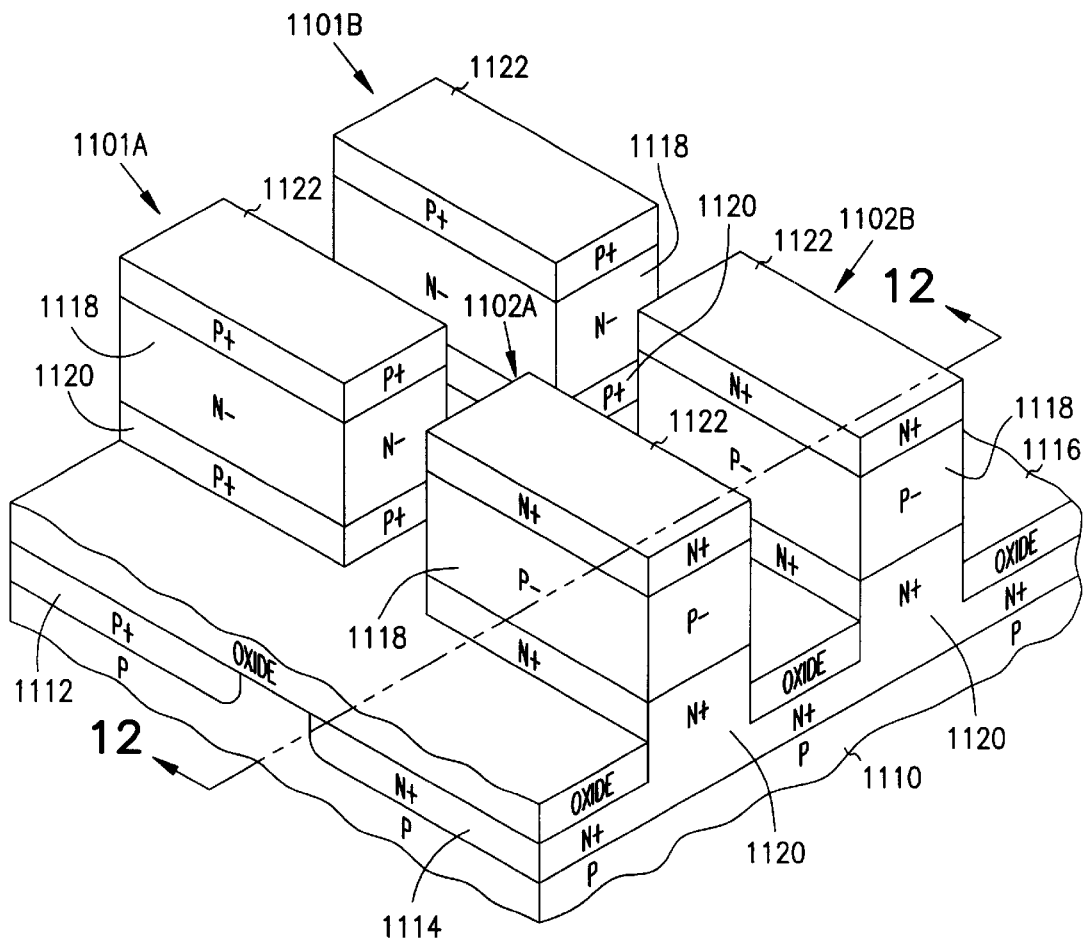
FIGS. 11–13 illustrate a method of fabricating the free standing vertical transistors according to the teachings of the present invention.
Figure 12:
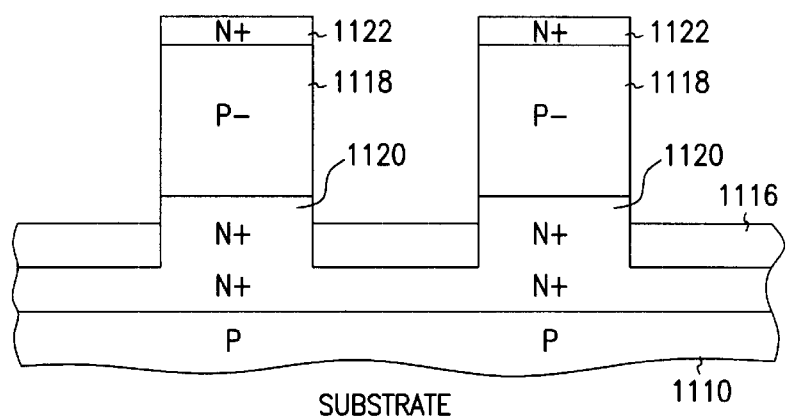
Figure 13:
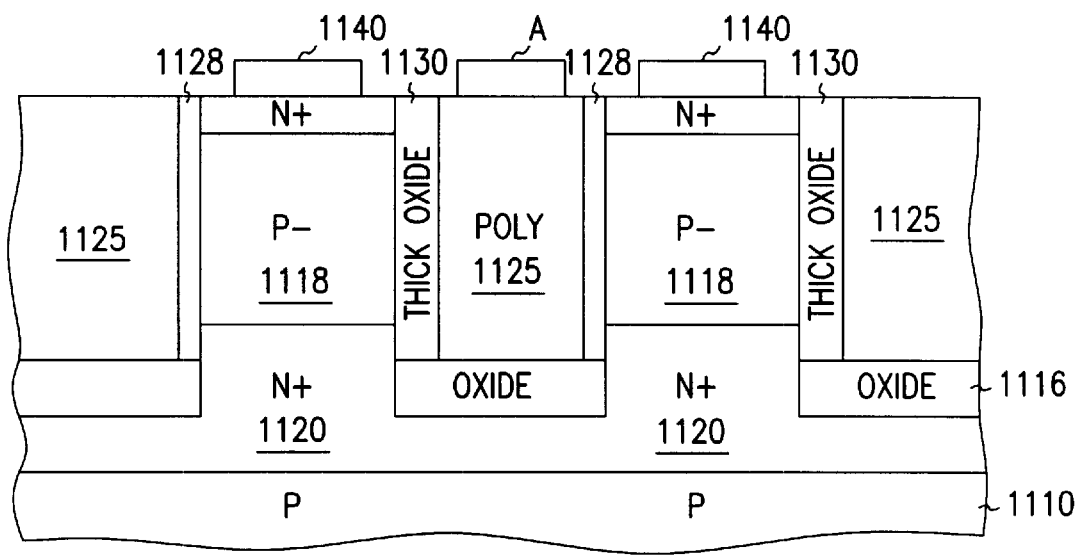

FIGS. 11–13 illustrate a method of fabricating the free standing vertical transistors according to the teachings of the present invention. As mentioned above, monotonic dynamic-static pseudo-NMOS logic circuit allows for the use of free standing vertical devices as part of the invention. FIG. 11 is a perspective view of free standing vertical NMOS and PMOS transistors 1100 as used in the monotonic dynamic-static pseudo-NMOS logic circuit of the invention. FIG. 11 is shown with a p-type substrate. A pair of free standing vertical PMOS transistors 1101A and 1101B are illustrated formed on a more heavily doped p-type, p+, region 1112 in the substrate 1110. And, a pair of free standing vertical NMOS transistors 1102A and 1102B are illustrated formed on an n+ layer 1114 formed in the substrate 1110. An oxide layer 1116 is formed on the surface of the substrate 1110 and surrounds the free standing vertical transistors, 1101A, 1101B, 1102A, and 1102B, for isolation. As shown in FIG. 11, each of the free standing vertical transistors, 1101A, 1101B, 1102A, and 1102B, forming a vertically stacked body region 1118 and first and second source/drain regions, 1120 and 1122 respectively, formed within a pillar of semiconductor material extending outwardly from a working surface of a substrate 1110. As shown in FIG. 11, each the pillar has an upper surface and a number of sides. FIG. 12 is a cross sectional view taken along cut line 12—12 of FIG. 11.

FIG. 13 illustrates the same cross sectional view following subsequent processing steps including gate, 1125, formation and wiring contacts, A and 1140. Wiring contact A represents one of the number of inputs coupled to the gates of free standing vertical n-channel transistors making up the logic circuitry of the monotonic dynamic-static pseudo-NMOS logic circuit for the invention. Wiring contact 1140 represents an output for either a dynamic logic circuit or static logic circuit of the monotonic dynamic-static pseudo-NMOS logic circuit for the invention. As shown in FIG. 13, a gate is formed associated with a side of the pillar and located below the upper surface of the pillar. In one embodiment of the present invention, forming the gates 1125 for the free standing vertical transistors, 1101A, 1101B, 1102A, and 1102B, includes forming vertically oriented gates. In an alternative embodiment, forming the gates 1125 for the free standing vertical transistors, 1101A, 1101B, 1102A, and 1102B, includes forming horizontally oriented gates.

A gate insulator, or gate oxide 1128 is grown or deposited on a side of each pillar separating the gate 1125 from the vertically oriented body region 1118. A thicker oxide layer, or insulator 1130 is grown or deposited on an opposing side of each pillar for isolating the gate 1125 from neighboring pillars. One method of forming the free standing vertical transistor pillars is described in U.S. Pat. No. 6,150,687 to Nobel et al. The same is incorporated in full herein by reference.

The free standing vertical transistors as used in the monotonic dynamic-static pseudo-NMOS logic circuit of the present include a number of different gate structures used in alternative embodiments. According to the teachings of the present invention these gate structures include:

(i) horizontal gate structures of deposited polisilicon, as described in U.S. Pat. No. 6,150,687 to Noble et al.;

(ii) horizontal replacement gate structures, a variation on U.S. Pat. No. 6,150,687, described in U.S. patent application Ser. No. 09/596,266 filed Jun. 16, 2000; and (iii) vertical gate structures as described in U.S. Pat. No. 6,072,209 to Noble et al.

In the embodiment shown in FIGS. 11–13, a silicon semiconductor substrate 1110 is provided. According to the teachings of the present invention, the substrate 1110 can be any of three different types of substrates:

(i) lightly doped p-type;

(ii) conventional commercial silicon on insulator substrates (e.g. SIMOX); or (iii) islands of silicon on insulator formed by techniques such as those described in U.S. Pat. No. 5,691,230 to Forbes, incorporated herein by reference.

Thus, in one embodiment according to the teachings of the present invention, each of the free standing vertical transistors, 1101A, 1101B, 1102A, and 1102B, includes forming the free standing vertical transistors, 1101A, 1101B, 1102A, and 1102B, on a silicon on insulator substrate. In an alternative embodiment, forming each of the free standing vertical transistors, 1101A, 1101B, 1102A, and 1102B, includes undercutting the pillars and oxidizing the substrate to isolate the pillars from the substrate as described in U.S. Pat. No. 5,691,230 to Forbes.

As will be understood by one of ordinary skill in the art upon reading this disclosure, SIMOX (Separation by Implanted Oxygen) involves implanting a high dose of oxygen ions at a sufficiently deep level within a silicon substrate. A subsequent anneal step forms a buried oxide layer in the substrate. After the anneal step, an additional layer of epitaxial silicon is usually deposited to obtain a sufficiently thick silicon layer on which to form a device.

According to the teachings of the present invention, a substrate of islands of silicon on insulator can be formed, for example, by directionally etching a silicon substrate, to form a plurality of trenches between protruding silicon rows; forming a silicon nitride cap on the silicon rows, extending partway down the sides of the trenches; isotropically etching the trenches, to partially undercut the silicon rows; and oxidizing the substrate, to fully undercut the silicon rows.

Figure 14:
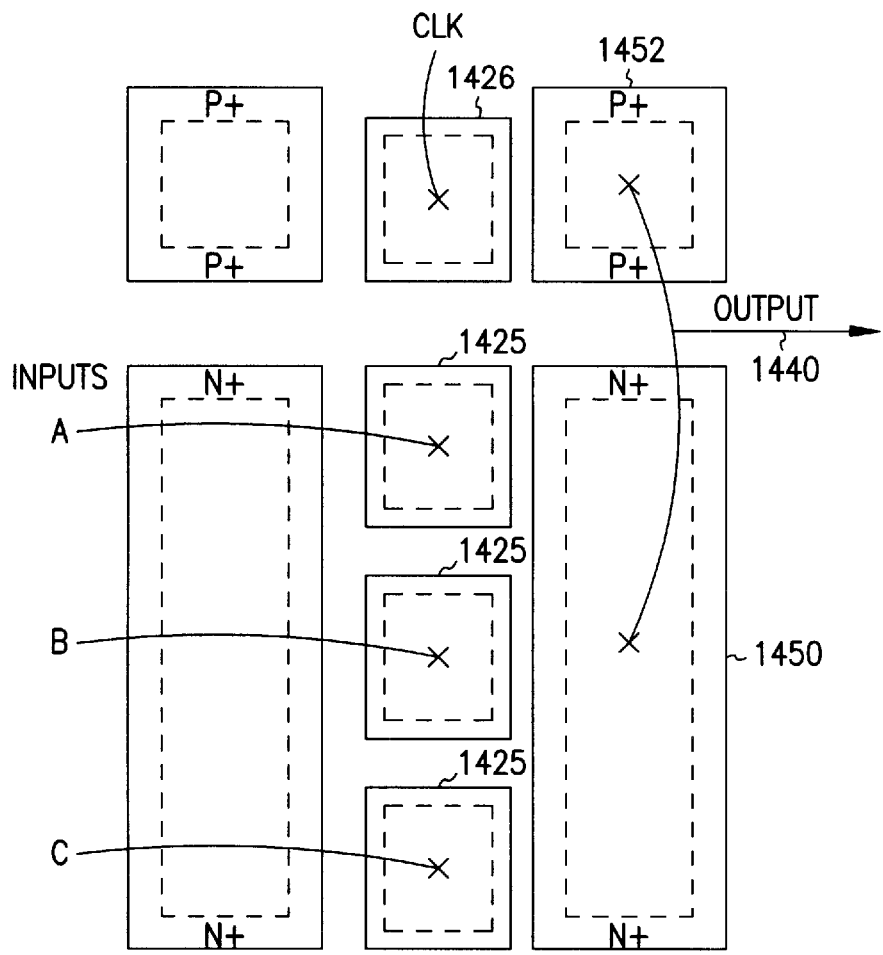
FIG. 14 is a top view illustrating wiring contacts consistent with vertical devices as used in the monotonic dynamic-static pseudo-NMOS logic circuit according to the teachings of the present invention.
Figure 15:
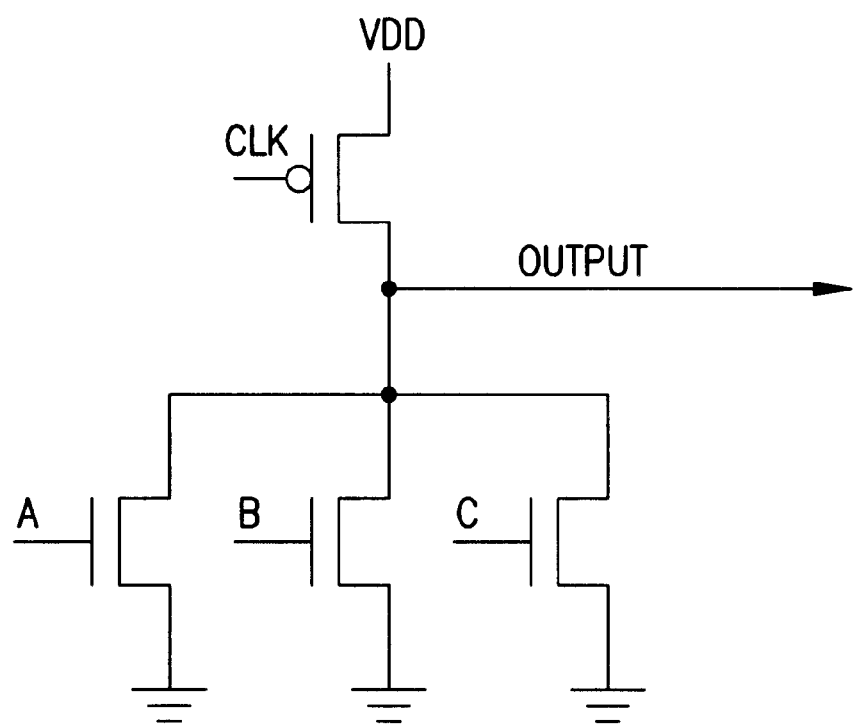
FIG. 15 is a schematic illustration of FIG. 14.

FIG. 14 is a top view illustrating wiring contacts consistent with vertical devices as used in the monotonic dynamic-static pseudo-NMOS logic circuit according to the teachings of the present invention. As shown in FIG. 14 a number of logic inputs A, B, and C are provided which are coupled to the gates 1425 for a number of free standing vertical n-channel transistors shown as block 1450. FIG. 14 further illustrates a CLK input coupled to the gate 1426 of a free standing vertical p-channel transistor 1452. As one of ordinary skill in the art will understand from viewing FIG. 14, the circuitry shown therein will comprise the dynamic logic circuit portion of the present invention, shown in schematic FIG. 15, where the free standing vertical p-channel transistor 1452 is coupled between a power supply, e.g. VDD, and an output for precharging the output high during a precharge stage prior to the arrival of a number of input signals at the number of logic inputs A, B, and C. An output 1440 is shown coupled to both the free standing vertical p-channel transistor 1452 and the number of free standing vertical n-channel transistors shown at block 1450. As described herein according to the teachings of the present invention, the output will be coupled to one of the number of inputs of a subsequent static logic circuit portion (not shown) as part of the monotonic dynamic-static pseudo-NMOS logic circuit. One of ordinary skill in the art will understand upon reading this disclosure, the similar manner in which the static logic circuit portion of the monotonic dynamic-static pseudo-NMOS logic circuit can be formed consistent with the use of free standing vertical transistor devices using only NMOS transistors for the logic evaluation. One of ordinary skill in the art will further appreciate the same would resemble the layout shown in FIG. 14 only with the input to gate 1426 serving as a CLK BAR input for receiving the complement of a clock signal provided to CLK input of the dynamic logic circuit portion and having the addition of a free standing vertical n-channel transistor having its gate also coupled to the CLK BAR input for precharging the output 1440 of the static logic circuit low during a precharge stage prior to the arrival of a number of logic inputs signals at the number of logic inputs A, B, and C in an evaluation stage. As stated previously, the present invention can be configured to accommodate any number of logic inputs to perform any desired logic function.

One of the differences between the illustrated implementation and the incorporated prior patents and application is the thick oxide formed along side one of the vertical walls of a pillar 204. Another difference is the utilization of both PMOS and NMOS vertical devices in the array. Three different types of gate structures have been described, and these can be utilized on three different disclosed types of substrates to form the gate arrays.

CONCLUSION

The above structures and fabrication methods have been described, by way of example and not by way of limitation, with respect to CMOS gate arrays with vertical transistors. Different types of gate structures are shown which can be utilized on three different types of substrates to form the CMOS gate arrays with vertical transistors.

The CMOS gate arrays with vertical transistors are configured as a logic circuit. The logic circuit includes a dynamic pull-down circuit having a number of logic inputs, a clock input, and an output. The number of logic inputs are coupled to a number of gates of free standing vertical n-channel transistors. The clock input is coupled to a gate of a free standing vertical p-channel transistor for precharging the output. The logic circuit further includes a static pull-up circuit having a number of logic inputs, a clock bar input, and an output. The number of logic inputs are coupled to a number of gates of free standing vertical n-channel transistors. The clock bar input is coupled to a gate of a free standing vertical n-channel transistor for precharging the output. And, the dynamic pull down circuit is cascaded with the static pull up circuit such that one of the number of inputs for the pull up circuit is coupled to the output of the pull down circuit.

What is claimed is:

1. A logic circuit, comprising:

a dynamic pull-down circuit, the pull-down circuit including a number of logic inputs coupled to a number of gates for free standing vertical n-channel transistors, and a clock input coupled to a gate of a free standing vertical p-channel transistor for precharging an output of the pull down circuit;

a static pull-up circuit, the pull-up circuit including a number of logic inputs coupled to a number of gates for free standing vertical n-channel transistors, and a clock bar input coupled to a gate of a free standing vertical n-channel transistor for precharging an output of the pull up circuit, wherein one of the number of inputs for the pull up circuit is coupled to the output of the pull down circuit.

2. The logic circuit of claim 1, wherein the clock input coupled to the gate of the free standing vertical p-channel transistor is configured for precharging the output of the pull down circuit high prior to the arrival of a number of logic input signals at the number of logic inputs.

3. The logic circuit of claim 1, wherein the clock bar input coupled to the gate of the free standing vertical n-channel transistor is configured for precharging the output of the pull up circuit low prior to the arrival of a number of logic input signals at the number of logic inputs.

4. The logic circuit of claim 1, wherein the free standing vertical p-channel transistor of the pull down circuit, having a gate coupled to the clock input, has a channel coupled between a power supply and the output.

5. The logic circuit of claim 1, wherein the free standing vertical n-channel transistor of the pull up circuit, having a gate coupled to the clock bar input, has a channel coupled between a low voltage supply and the output.

6. A logic circuit, comprising:
  a dynamic logic circuit having a number of logic inputs, a clock input, and an output, wherein the number of logic inputs are coupled to a number of gates of free standing vertical n-channel transistors, and the clock input is coupled to a gate of a free standing vertical p-channel transistor for precharging the output;
  a static logic circuit, having a number of logic inputs, a clock bar input, and an output, wherein the number of logic inputs are coupled to a number of gates of free standing vertical n-channel transistors, the clock bar input is coupled to a gate of a free standing vertical n-channel transistor for precharging the output, and wherein one of the number of inputs for the static logic circuit is coupled to the output of the dynamic logic circuit.

7. The logic circuit of claim 6, wherein the output of the static logic circuit is coupled to a logic input for a subsequent dynamic logic circuit.

8. The logic circuit of claim 6, wherein the free standing vertical p-channel transistor in the dynamic logic circuit is coupled between a power supply and the output for precharging the output of the dynamic logic circuit high.

9. The logic circuit of claim 8, wherein the free standing vertical p-channel transistor in the dynamic logic circuit is configured for precharging the output prior to an arrival of a number of input signals on the number of logic inputs of the dynamic logic circuit.

10. The logic circuit of claim 6, wherein the free standing vertical n-channel transistor in the static logic circuit, having a gate coupled to the clock bar input, is coupled between a low voltage supply and the output for precharging the output of the static logic circuit low.

11. The logic circuit of claim 10, wherein the free standing vertical n-channel transistor in the static logic circuit, having a gate coupled to the clock bar input, is configured for precharging the output prior to an arrival of a number of input signals on the number of logic inputs of the static logic circuit.

12. A monotonic dynamic-static pseudo-NMOS logic circuit, comprising:
  a dynamic logic circuit having a number of logic inputs, a clock input, and an output, wherein the number of logic inputs are coupled to a number of gates of free standing vertical n-channel transistors, and the clock input is coupled to a gate of a free standing vertical p-channel transistor for precharging the output high;
  a static logic circuit, having a number of logic inputs, a clock bar input, and an output, wherein the number of logic inputs are coupled to a number of gates of free standing vertical n-channel transistors, the clock bar input is coupled to a gate of a free standing vertical n-channel transistor for precharging the output low, and wherein one of the number of inputs for the static logic circuit is coupled to the output of the dynamic logic circuit.

13. The monotonic dynamic-static pseudo-NMOS logic circuit of claim 12, wherein the output of the static logic circuit is coupled to a logic input for a subsequent dynamic logic circuit.

14. The monotonic dynamic-static pseudo-NMOS logic circuit of claim 12, wherein the free standing vertical p-channel transistor in the dynamic logic circuit is coupled between a power supply and the output for precharging the output of the dynamic logic circuit during a precharge stage.

15. The monotonic dynamic-static pseudo-NMOS logic circuit of claim 14, wherein the number of logic inputs coupled to the number of gates of free standing vertical n-channel transistors are configured for receiving a number of input signals during an evaluation stage when the clock input receives a high signal.

16. The monotonic dynamic-static pseudo-NMOS logic circuit of claim 12, wherein the free standing vertical n-channel transistor in the static logic circuit, having a gate coupled to the clock bar input, is coupled between a low voltage supply and the output for precharging the output of the static logic circuit during a precharge stage.

17. The monotonic dynamic-static pseudo-NMOS logic circuit of claim 16, wherein the number of logic inputs coupled to the number of gates of free standing vertical n-channel transistors in the static logic circuit are configured for receiving a number of input signals during an evaluation stage when the clock bar input receives a low signal.

18. A monotonic dynamic-static pseudo-NMOS logic circuit, comprising:
  a dynamic logic circuit having a number of logic inputs, a clock input, and an output, wherein the number of logic inputs are coupled to a number of gates of free standing vertical n-channel transistors, and the clock input is coupled to a gate of a free standing vertical p-channel transistor coupled between a power supply and the output for precharging the output of the dynamic logic circuit during a precharge stage;
  a static logic circuit, having a number of logic inputs, a clock bar input, and an output, wherein the number of logic inputs are coupled to a number of gates of free standing vertical n-channel transistors, the clock bar input is coupled to a gate of a free standing vertical n-channel transistor coupled between a low voltage supply and the output for precharging the output of the static logic circuit during a precharge stage; and
  wherein one of the number of inputs for the static logic circuit is coupled to the output of the dynamic logic circuit.

19. The monotonic dynamic-static pseudo-NMOS logic circuit of claim 18, wherein the output of the static logic circuit is coupled to a logic input for a subsequent dynamic logic circuit.

20. The monotonic dynamic-static pseudo-NMOS logic circuit of claim 18, wherein the number of logic inputs coupled to the number of gates of free standing vertical n-channel transistors in the dynamic logic circuit are configured for receiving a number of input signals during an evaluation stage when the clock input receives a high signal.

21. The monotonic dynamic-static pseudo-NMOS logic circuit of claim 18, wherein the number of logic inputs coupled to the number of gates of free standing vertical n-channel transistors in the static logic circuit are configured for receiving a number of input signals during an evaluation stage when the clock bar input receives a low signal.

22. A monotonic dynamic-static pseudo-NMOS logic circuit, comprising:
 a dynamic logic circuit having a number of logic inputs, a clock input, and an output, wherein the number of logic inputs are coupled to a number of gates of free standing vertical n-channel transistors, and the clock input is coupled to a gate of a free standing vertical p-channel transistor wherein the free standing vertical p-channel transistor in the dynamic logic circuit is coupled between a power supply and the output for precharging the output of the dynamic logic circuit high during a precharge stage prior to an arrival of a number of input signals on the number of logic inputs of the dynamic logic circuit;
 a static logic circuit, having a number of logic inputs, a clock bar input, and an output, wherein the number of logic inputs are coupled to a number of gates of free standing vertical n-channel transistors, the clock bar input is coupled to a gate of a free standing vertical n-channel transistor which is coupled between a low voltage supply and the output for precharging the output of the static logic circuit low during a precharge stage prior to an arrival of a number of input signals on the number of logic inputs of the static logic circuit, and wherein one of the number of inputs for the static logic circuit is coupled to the output of the dynamic logic circuit.

23. The monotonic dynamic-static pseudo-NMOS logic circuit of claim 22, wherein the output of the static logic circuit is coupled to a logic input for a subsequent dynamic logic circuit.

24. The monotonic dynamic-static pseudo-NMOS logic circuit of claim 22, wherein the number of logic inputs coupled to the number of gates of free standing vertical n-channel transistors in the dynamic logic circuit are configured for receiving a number of input signals during an evaluation stage when the clock input receives a high signal.

25. The monotonic dynamic-static pseudo-NMOS logic circuit of claim 22, wherein the number of logic inputs coupled to the number of gates of free standing vertical n-channel transistors in the static logic circuit are configured for receiving a number of input signals during an evaluation stage when the clock bar input receives a low signal.

26. A CMOS gate array, comprising:
 a dynamic logic circuit having a number of logic inputs, a clock input, and an output, wherein the number of logic inputs are coupled to a number of gates of free standing vertical n-channel transistors, and the clock input is coupled to a gate of a free standing vertical p-channel transistor for precharging the output;
 a static logic circuit, having a number of logic inputs, a clock bar input, and an output, wherein the number of logic inputs are coupled to a number of gates of free standing vertical n-channel transistors, the clock bar input is coupled to a gate of a free standing vertical n-channel transistor for precharging the output, and wherein one of the number of inputs for the static logic circuit is coupled to the output of the dynamic logic circuit; and
 wherein each of the free standing vertical transistors includes:
  a vertically stacked body region and first and second source/drain regions formed within a pillar of semiconductor material extending outwardly from a working surface of a substrate, the pillar having an upper surface and a number of sides; and
  a gate associated with a side of the pillar and located below the upper surface of the pillar.

27. The CMOS gate array of claim 26, wherein the gates for the free standing vertical transistors include vertically oriented gates.

28. The CMOS gate array of claim 26, wherein the gates for the free standing vertical transistors include horizontally oriented gates.

29. A CMOS gate array, comprising:
 a number of dynamic logic circuits, each dynamic logic circuit including a number of logic inputs, a clock input, and an output, wherein the number of logic inputs are coupled to a number of gates of free standing vertical n-channel transistors, and the clock input is coupled to a gate of a free standing vertical p-channel transistor for precharging the output;
 a number of static logic circuits, each static logic circuit including a number of logic inputs, a clock bar input, and an output, wherein the number of logic inputs are coupled to a number of gates of free standing vertical n-channel transistors, the clock bar input is coupled to a gate of a free standing vertical n-channel transistor for precharging the output; and
 wherein number of dynamic logic circuits and the number of static logic circuits are cascaded such that the output of one dynamic logic circuit is coupled to one of the number of logic inputs for a subsequent static logic circuit, and the output of one of the static logic circuits is coupled to the one of the number of logic inputs for a subsequent dynamic logic circuit.

30. The CMOS gate array of claim 29, wherein the free standing vertical p-channel transistor in each dynamic logic circuit is coupled between a power supply and the output for precharging the output of the dynamic logic circuit high.

31. The CMOS gate array of claim 30, wherein the free standing vertical p-channel transistor in the dynamic logic circuit is configured for precharging the output prior to an arrival of a number of input signals on the number of logic inputs of the dynamic logic circuit.

32. The CMOS gate array of claim 29, wherein the free standing vertical n-channel transistor in each static logic circuit, having a gate coupled to the clock bar input, is coupled between a low voltage supply and the output for precharging the output of the static logic circuit low.

33. The CMOS gate array of claim 32, wherein the free standing vertical n-channel transistor in the static logic circuit, having a gate coupled to the clock bar input, is configured for precharging the output prior to an arrival of a number of input signals on the number of logic inputs of the static logic circuit.

34. A CMOS gate array, comprising:
 a number of dynamic logic circuits, each dynamic logic circuit including a number of logic inputs, a clock input, and an output, wherein the number of logic inputs are coupled to a number of gates of free standing vertical n-channel transistors, and the clock input is coupled to a gate of a free standing vertical p-channel transistor for precharging the output high;
 a number of static logic circuits, each static logic circuit including a number of logic inputs, a clock bar input, and an output, wherein the number of logic inputs are coupled to a number of gates of free standing vertical n-channel transistors, the clock bar input is coupled to a gate of a free standing vertical n-channel transistor for precharging the output low; and wherein number of dynamic logic circuits and the number of static logic circuits are cascaded such that the output of one dynamic logic circuit is coupled to one of the number of logic inputs for a subsequent static logic circuit, and the output of one of the static logic circuits is coupled to the one of the number of logic inputs for a subsequent dynamic logic circuit.

35. The CMOS gate array of claim 34, wherein the free standing vertical p-channel transistor in each dynamic logic circuit is coupled between a power supply and the output for precharging the output of the dynamic logic circuit during a precharge stage.

36. The CMOS gate array of claim 35, wherein the number of logic inputs coupled to the number of gates of free standing vertical n-channel transistors are configured for receiving a number of input signals during an evaluation stage when the clock input receives a high signal.

37. The CMOS gate array of claim 34, wherein the free standing vertical n-channel transistor in each static logic circuit, having a gate coupled to the clock bar input, is coupled between a low voltage supply and the output for precharging the output of the static logic circuit during a precharge stage.

38. The CMOS gate array of claim 37, wherein the number of logic inputs coupled to the number of gates of free standing vertical n-channel transistors in the static logic circuit are configured for receiving a number of input signals during an evaluation stage when the clock bar input receives a low signal.

39. A CMOS gate array, comprising:
a number of dynamic logic circuits, each dynamic logic circuit including a number of logic inputs, a clock input, and an output, wherein the number of logic inputs are coupled to a number of gates of free standing vertical n-channel transistors, and the clock input is coupled to a gate of a free standing vertical p-channel transistor coupled between a power supply and the output for precharging the output high during a precharge stage prior to an arrival of a number of input signals on the number of logic inputs of the dynamic logic circuit;
a number of static logic circuits, each static logic circuit including a number of logic inputs, a clock bar input, and an output, wherein the number of logic inputs are coupled to a number of gates of free standing vertical n-channel transistors, the clock bar input is coupled to a gate of a free standing vertical n-channel transistor coupled between a low voltage supply and the output of the static logic circuit for precharging the output low during a precharge stage prior to an arrival of a number of input signals on the number of logic inputs of the static logic circuit;
wherein number of dynamic logic circuits and the number of static logic circuits are cascaded such that the output of one dynamic logic circuit is coupled to one of the number of logic inputs for a subsequent static logic circuit, and the output of one of the static logic circuits is coupled to the one of the number of logic inputs for a subsequent dynamic logic circuit; and
wherein each of the free standing vertical transistors includes:
a vertically stacked body region and first and second source/drain regions formed within a pillar of semiconductor material extending outwardly from a working surface of a substrate, the pillar having an upper surface and a number of sides; and
a gate associated with a side of the pillar and located below the upper surface of the pillar.

40. The CMOS gate array of claim 39, wherein the gates for the free standing vertical transistors include vertically oriented gates.

41. The CMOS gate array of claim 39, wherein the gates for the free standing vertical transistors include horizontally oriented gates.

42. The CMOS gate array of claim 39, wherein the number of logic inputs coupled to the number of gates of free standing vertical n-channel transistors in the dynamic logic circuit are configured for receiving a number of input signals during an evaluation stage when the clock input receives a high signal.

43. The CMOS gate array of claim 39, wherein the number of logic inputs coupled to the number of gates of free standing vertical n-channel transistors in the static logic circuit are configured for receiving a number of input signals during an evaluation stage when the clock bar input receives a low signal.

44. The CMOS gate array of claim 39, wherein cascading a number of dynamic logic circuits and a number of static logic circuits, each circuit having a number of logic inputs coupled to the number of gates of free standing vertical n-channel transistors includes providing a number of logic inputs in the static logic circuit which are configured to receive a number of input signals during an evaluation stage when the clock bar input receives a low signal.

45. A method for performing logic functions, comprising:
coupling a dynamic logic circuit to a static logic circuit, each having a number of logic inputs and an output, wherein the number of logic inputs are coupled to a number of gates of free standing vertical n-channel transistors, wherein the dynamic logic circuit further includes a clock input and the static logic circuit includes a clock bar input, and wherein one of the number of inputs for the static logic circuit is coupled to the output of the dynamic logic circuit;
precharging the output of the dynamic logic circuit during a precharge stage by providing a low clock signal to the clock input, the clock input being coupled to a gate of a free standing vertical p-channel transistor coupled between a power supply and the output; and
precharging the output of the static logic circuit during the precharge stage by providing a high clock signal to the clock bar input, the clock bar input being coupled to a gate of a free standing vertical n-channel transistor coupled between a low voltage supply and the output.

46. The method of claim 45, wherein the method further includes providing an output signal from the output of the static logic circuit to one of a number of logic inputs for a subsequent dynamic logic circuit.

47. The method of claim 45, wherein the method further includes receiving a number of input signals at the number of logic inputs coupled to the number of gates of free standing vertical n-channel transistors in the dynamic logic circuit during an evaluation stage, wherein the clock input receives a high signal during the evaluation stage.

48. The method of claim 45, wherein the method further includes receiving a number of input signals at the number of logic inputs coupled to the number of gates of free standing vertical n-channel transistors in the static logic circuit during the evaluation stage, wherein the clock bar input receives a low signal during the evaluation stage.

49. A method for operating a CMOS gate array, comprising:
coupling a static logic circuit to a dynamic logic circuit, each having a number of logic inputs and an output, wherein the number of logic inputs are coupled to a number of gates of free standing vertical n-channel transistors, wherein the static logic circuit further includes a clock bar input and the dynamic logic circuit includes a clock input, and wherein one of the number of inputs for the dynamic logic circuit is coupled to the output of the static logic circuit;

precharging the output of the static logic circuit during a precharge stage prior to an arrival of a number of input signals on the number of logic inputs of the static logic circuit by providing a high clock signal to the clock bar input, the clock bar input being coupled to a gate of a free standing vertical n-channel transistor coupled between a low voltage supply and the output; and precharging the output of the dynamic logic circuit during the precharge stage prior to an arrival of a number of input signals on the number of logic inputs of the dynamic logic circuit by providing a low clock signal to the clock input, the clock input being coupled to a gate of a free standing vertical p-channel transistor coupled between a power supply and the output.

50. The method of claim 49, wherein the method further includes providing an output signal from the output of the dynamic logic circuit to one of a number of logic inputs for a subsequent static logic circuit.

51. The method of claim 49, wherein the method further includes receiving a number of input signals at the number of logic inputs coupled to the number of gates of free standing vertical n-channel transistors in the static logic circuit during an evaluation stage, wherein the clock bar input receives a low signal during the evaluation stage.

52. The method of claim 49, wherein the method further includes receiving a number of input signals at the number of logic inputs coupled to the number of gates of free standing vertical n-channel transistors in the dynamic logic circuit during the evaluation stage, wherein the clock input receives a high signal during the evaluation stage.

53. A method for forming a logic circuit, comprising:
coupling a dynamic logic circuit to a static logic circuit, each having a number of logic inputs and an output, wherein the number of logic inputs are coupled to a number of gates of free standing vertical n-channel transistors, wherein the dynamic logic circuit further includes a clock input and the static logic circuit includes a clock bar input, and wherein one of the number of inputs for the static logic circuit is coupled to the output of the dynamic logic circuit;

coupling the clock input to a gate of a free standing vertical p-channel transistor coupled between a power supply and the output of the dynamic logic circuit for precharging the output during a precharge stage; and coupling the clock bar input to a gate of a free standing vertical n-channel transistor coupled between a low voltage supply and the output of the static logic circuit for precharging the output during a precharge stage.

54. The method of claim 53, wherein the method further includes coupling the output of the static logic circuit to a logic input for a subsequent dynamic logic circuit.

55. The method of claim 53, wherein the method further includes configuring the number of logic inputs coupled to the number of gates of free standing vertical n-channel transistors in the dynamic logic circuit to receive a number of input signals during an evaluation stage when the clock input receives a high signal.

56. The method of claim 53, wherein the method further includes configuring the number of logic inputs coupled to the number of gates of free standing vertical n-channel transistors in the static logic circuit to receive a number of input signals during an evaluation stage when the clock bar input receives a low signal.

57. A method of forming a CMOS gate array, comprising:
cascading a number of dynamic logic circuits and a number of static logic circuits, each circuit having a number of logic inputs and an output, wherein the number of logic inputs in each circuit are coupled to a number of gates of free standing vertical n-channel transistors, wherein each dynamic logic circuit further includes a clock input and each static logic circuit includes a clock bar input;

coupling the clock input in each dynamic logic circuit to a gate of a free standing vertical p-channel transistor coupled between a power supply and the output of the dynamic logic circuit for precharging the output during a precharge stage prior to the arrival of a number of input signals to the number of logic inputs;

coupling the clock bar input in each static logic circuit to a gate of a free standing vertical n-channel transistor coupled between a low voltage supply and the output of the static logic circuit for precharging the output during the precharge stage prior to the arrival of a number of input signals to the number of logic inputs;

wherein cascading the number of dynamic logic circuits and the number of static logic circuits includes cascading the circuits such that the output of one dynamic logic circuit is coupled to one of the number of logic inputs for a subsequent static logic circuit, and the output of one of the static logic circuits is coupled to the one of the number of logic inputs for a subsequent dynamic logic circuit; and wherein forming each of the free standing vertical transistors includes:
forming a vertically stacked body region and first and second source/drain regions formed within a pillar of semiconductor material extending outwardly from a working surface of a substrate, the pillar having an upper surface and a number of sides; and
forming a gate associated with a side of the pillar and located below the upper surface of the pillar.

58. The method of claim 57, wherein forming the gates for the free standing vertical transistors includes forming vertically oriented gates.

59. The method of claim 57, wherein forming the gates for the free standing vertical transistors includes forming horizontally oriented gates.

60. The method of claim 57, wherein forming each of the free standing vertical transistors includes forming the free standing vertical transistors on a silicon on insulator substrate.

61. The method of claim 57, wherein forming each of the free standing vertical transistors includes undercutting the pillars and oxidizing the substrate to isolate the pillars from the substrate.

62. The method of claim 57, wherein cascading a number of dynamic logic circuits and a number of static logic circuits, each circuit having a number of logic inputs coupled to the number of gates of free standing vertical n-channel transistors includes providing a number of logic inputs in the dynamic logic circuit which are configured to receive a number of input signals during an evaluation stage when the clock input receives a high signal.

* * * * *

UNITED STATES PATENT AND TRADEMARK OFFICE
CERTIFICATE OF CORRECTION

PATENT NO. : 6,597,203 B2  Page 1 of 1
DATED : July 22, 2003
INVENTOR(S) : Leonard Forbes It is certified that error appears in the above-identified patent and that said Letters Patent is hereby corrected as shown below:

Title page,
Item [56], References Cited, U.S. PATENT DOCUMENTS, "4,797,580 A" reference, delete "1/1989" and insert -- 6/1989 -- therefor.

Column 1,
Line 1, delete "CM OS" and insert -- CMOS -- therefor.
Line 20, delete "modem" and insert -- modern -- therefor.

Signed and Sealed this

Twentieth Day of January, 2004

JON W. DUDAS
*Acting Director of the United States Patent and Trademark Office*